Sept. 10, 1963 S. S. CHARSCHAN 3,103,137

MEANS FOR SECURING CONDUCTIVE LEADS TO SEMICONDUCTIVE DEVICES

Filed March 17, 1960 4 Sheets-Sheet 1

INVENTOR
S. S. CHARSCHAN
BY Albert R. Hodges
ATTORNEY

Sept. 10, 1963 S. S. CHARSCHAN 3,103,137

MEANS FOR SECURING CONDUCTIVE LEADS TO SEMICONDUCTIVE DEVICES

Filed March 17, 1960 4 Sheets-Sheet 2

INVENTOR
S. S. CHARSCHAN
BY Albert R. Hodges
ATTORNEY

INVENTOR
S. S. CHARSCHAN
BY Albert R. Hodges
ATTORNEY

INVENTOR
S. S. CHARSCHAN
BY
Albert R. Hodges
ATTORNEY

3,103,137
MEANS FOR SECURING CONDUCTIVE LEADS TO SEMICONDUCTIVE DEVICES

Sidney S. Charschan, Levittown, Pa., assignor to Western Electric Company, Incorporated, New York, N.Y., a corporation of New York
Filed Mar. 17, 1960, Ser. No. 15,737
20 Claims. (Cl. 78—82)

This invention relates to means for securing conductive leads to semiconductive devices, and more particularly to such means which utilize compression-bonding techniques.

The small size of semiconductive devices has complicated the task of completely mechanizing their production. To date, the manufacture of transistors, for example, is interrupted by a number of laborius manual steps.

A particular difficulty lies in the securing or bonding of conductive leads, which are often finer than a human hair, to the semiconductive devices. In the prior art, the bonding of these leads required meticulous and time-consuming care. Part of the difficulty arose from the lack of continuous control over each individual lead employed. Thus, for each bond made, an operator had to search for and reassert control over an unsupported end of a tiny individual lead. An additional problem derived from the fact that the bonding tools employed had to be accurately reoriented for each bond made. Accordingly, the manufacture of each transistor required the repetition of a plurality of individual bonding steps. Such procedures were incompatible with the mechanization of the bonding operation.

An object of the invention is to provide new and improved means for bonding conductive leads to semiconductive devices.

A further object of the invention is to provide new and improved means utilizing compression-bonding techniques for bonding conductive leads to semiconductive devices.

Another object of the invention is to provide new and improved means for bonding conductive leads to semiconductive devices which lend themselves to mechanization of the bonding operation.

An apparatus illustrating certain aspects of the invention may comprise a bonding tool having first and second bonding elements, the first bonding element being arranged to apply pressure against a first surface and the second bonding element being arranged to apply pressure against a second surface, means for orienting a first portion of a wire-like member between the first bonding element and the first surface, means including the first bonding element for pressing the first portion of the wire-like member against the first surface to form a first bond between the member and the first surface, means for moving the bonding tool laterally past the second surface, and means including the second bonding element for sweeping and pressing a second portion of the wire-like member against the second surface to form a second bond between the member and the second surface.

A complete understanding of the invention may be obtained from the following detailed description of means forming specific embodiments thereof when read in conjunction with the appended drawings, in which.

Figure 1:
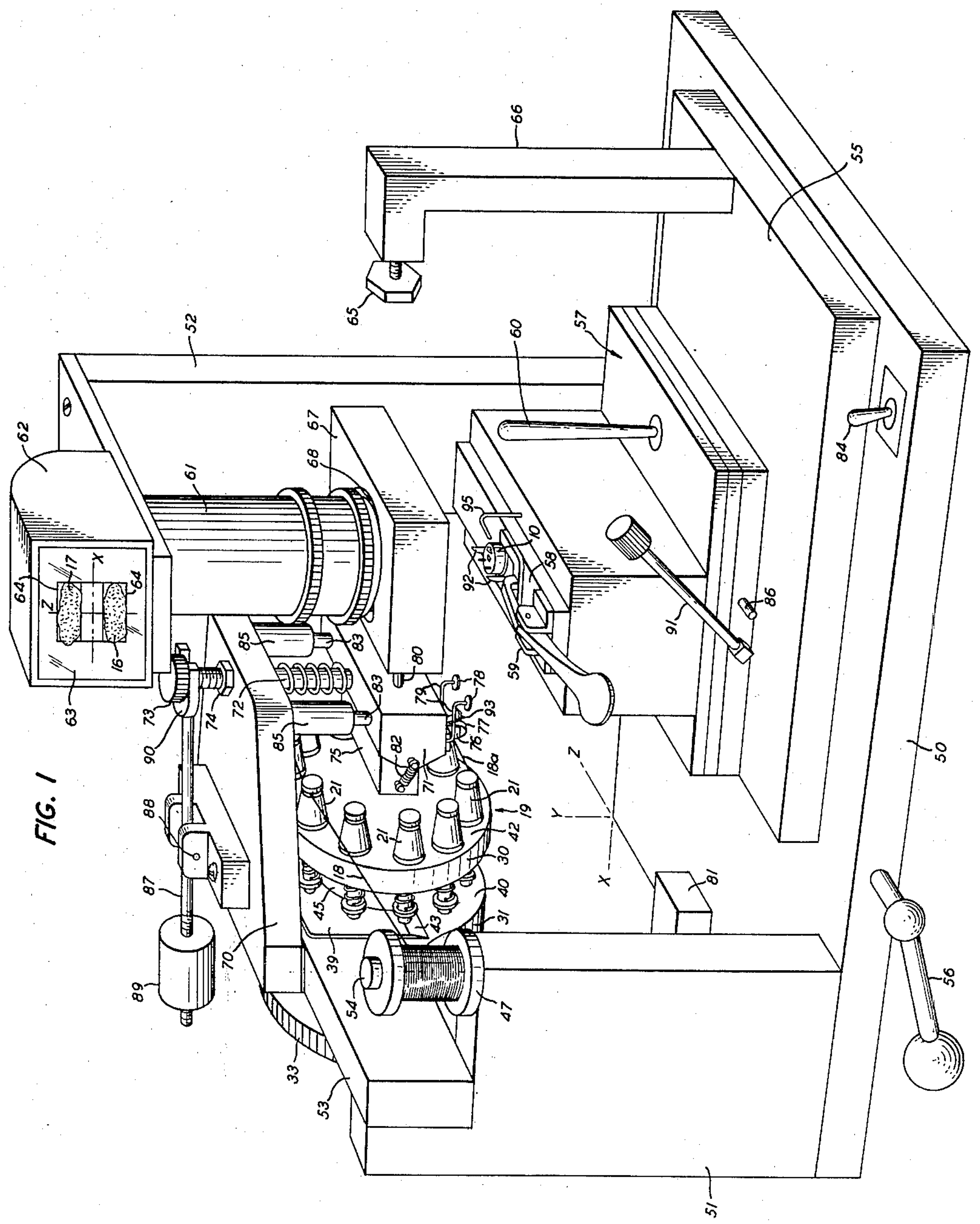
FIG. 1 is a perspective view of a bonding apparatus forming one embodiment of the invention.
Figure 3:
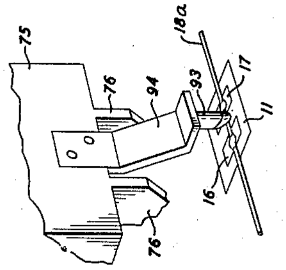
FIGS. 2, 3 and 4 are perspective views illustrating the operation of a bonding tool utilized in the apparatus of FIG. 1.
Figure 4:
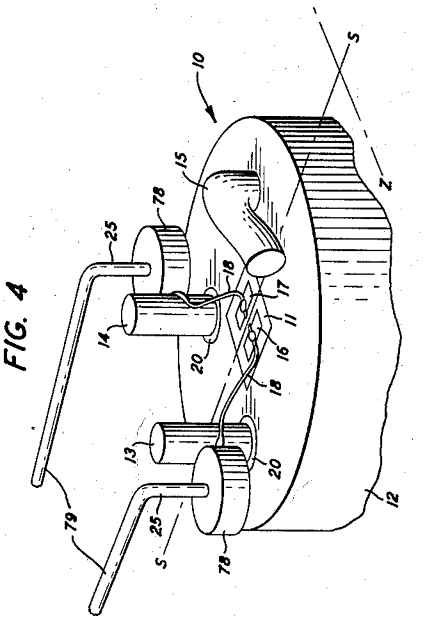
Figure 2:
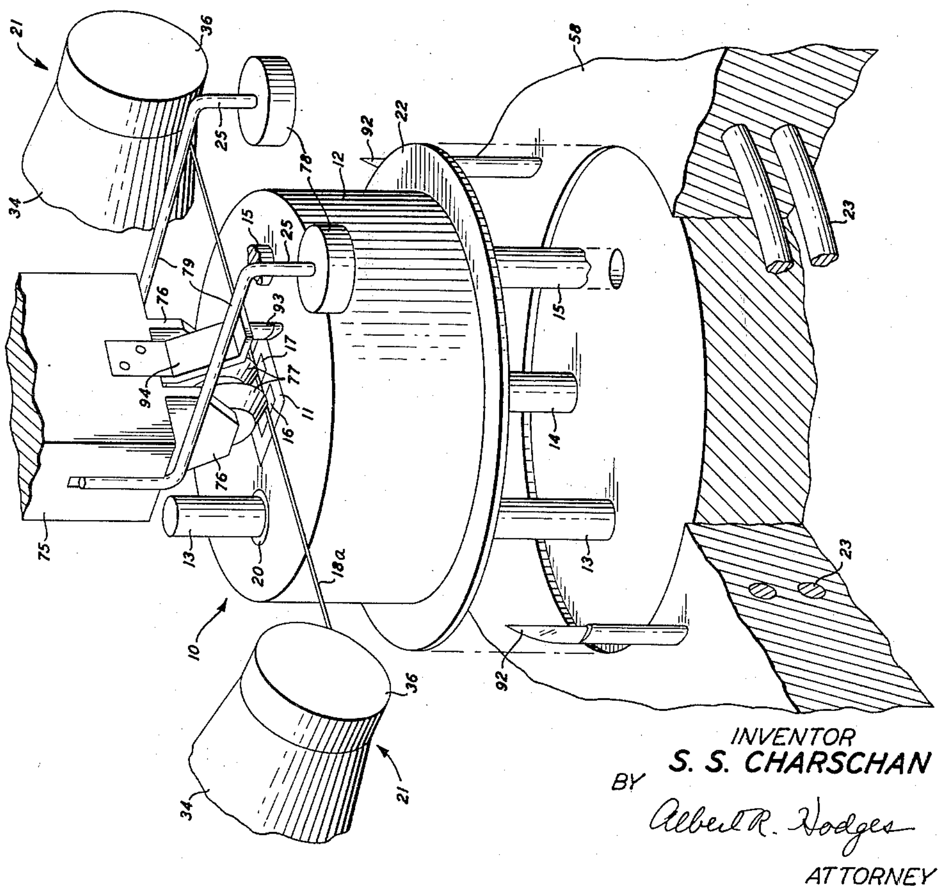

The embodiment of the invention illustrated in FIG. 1 is adapted to bond conductive leads to a transistor 10. As is best seen in FIGS. 2–4, a transistor normally includes a semiconductive wafer 11 mounted upon a body portion 12. The semiconductive wafer 11 is divided into three regions known as the base, emitter and collector. These regions are individually connected to circuitry external to the transistor by means of a base terminal 13, an emitter terminal 14 and a collector terminal 15.

Each region of the wafer 11 must, therefore, be electrically connected to its associated terminal. Ordinarily, one of the regions of the wafer, the collector for example, is grounded. This region may be directly connected to the body portion 12 of the transistor. Accordingly, the collector terminal 15 need only be joined to the body portion 12 in order to be connected to the collector region.

The electrical connection of the emitter and base regions to their respective terminals, however, is not so readily effected. Often, a separate metallic stripe, which may be of aluminum, is sputtered onto each of these regions to form a terminal surface. Thus, in the wafer 11, a metallic stripe 16 is sputtered onto the base region and a metallic stripe 17 is sputtered onto the emitter region. These metallic stripes (approximately 2 mils by 4 mils in size) are electrically connected by means of extremely fine conductive leads 18 (FIG. 4) to their respective terminals 13 and 14. The conductive leads 18 are normally made of gold wire having a diameter of approximately 1 mil. The terminals, in turn, are inserted through the body portion 12 and supported by means of insulating sleeves 20. Accordingly, a bonding operation is required wherein the metallic stripes 16 and 17 are connected to their respective terminals 13 and 14 by means of the individual leads 18.

Part of the apparatus of FIG. 1 comprises a chuck 19 which is adapted to continuously exercise control over the fine conductive lead wire 18 while successively feeding and accurately locating preselected lengths of the wire into bonding position. Other views of the chuck 19 are shown in FIGS. 5 and 6.

Figures 5, 6:
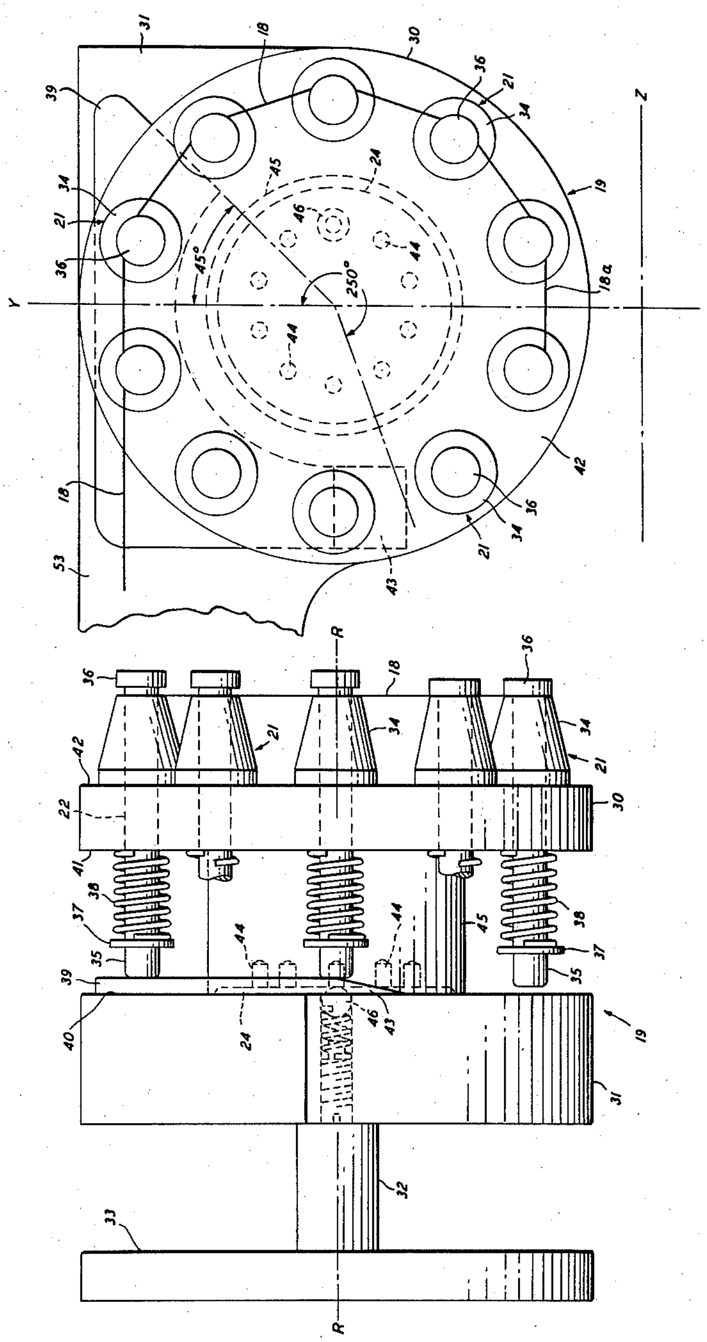
FIG. 5 is a side view of a conductive lead positioning chuck forming part of the apparatus of FIG. 1.
FIG. 6 is a front view of the chuck of FIG. 5.

The chuck 19 includes a disc 30 mounted on a shaft 32 which passes through a housing 31 so as to rotate about a horizontally disposed axis R—R (FIG. 5). A drive wheel 33 is provided whereby the disc 30 may be manually rotated. The disc 30 has a plurality of equally spaced clamping elements 21 mounted on its front face 42 in a circular array about the axis R—R. In the present embodiment, ten clamping elements are employed. This number may, of course, be varied in accordance with design requirements.

Each clamping element comprises a bushing 34. A cylindrical bore 22 passes through each of the bushings 34 and continues through the disc 30. The axes of the bores 22 are disposed in parallel relationship to the axis of rotation R—R. A mating cylindrical shaft 35 passes through each of the bores 22 so as to reciprocate therein. Each shaft 35 protrudes from its associated bushing 34, the protruding end of the shaft terminating in an enlarged head 36. The opposite end of each shaft protrudes from a back face 41 of the disc 30 and is provided with a stop washer 37. A spring 38 is arranged around each shaft 35 between the back face 41 and the stop washer 37. This spring normally biases the head 36 of each element against its associated bushing 34, as is the case with the clamping elements at the bottom of the disc 30 in FIG. 5.

The head 36 and the bushing 34 of each clamping element 21 act as the jaws of a vise to grip the conductive lead 18 therebetween. Accordingly, control means are provided for selectively opening and closing the clamping elements to effect this gripping action. In this embodiment, such means comprises a feather-edged cam 39 which is provided with a beveled leading edge 43. The feather-edged cam is mounted on a face 40 of the housing 31 which lies facing and parallel to the back face 41 of the disc 30. The cam therefore acts to decrease the gap between the faces 40 and 41 over a preselected area according to its shape and placement. Furthermore, the shafts 35 are of a length such that (in the normal closed position of the clamping elements 21) they do not quite bridge the gap between the faces 40 and 41.

In order to act as a control means, the cam 39 is positioned so as to cover a preselected arc of the circular path followed by the shafts 35. Thus, assuming that the disc 30 is rotated in a clockwise direction as viewed in FIG. 6, the shafts 35 will successively ride up the leading edge 43 of the cam and onto its surface. Each succeeding shaft is thus pushed against the action of its spring 38 to separate its associated head 36 and bushing 34. Furthermore, such separation is maintained between preselected angular positions on the circular path which correspond to the locations of the leading and trailing edges of the cam 39.

In this embodiment, as shown in FIG. 6, the leading edge of the cam 39 is located at an angle of 250° and the trailing edge at an angle of 45° relative to a vertical axis Y. The cam therefore covers an arc of 155°. This results in at least five of the equally spaced clamping elements 21 being closed at any instant of time.

The chuck 19 is adapted to accurately locate preselected lengths of the lead 18 in bonding position. Advantageously, the lead is provided in continuous form on a spool 47 (FIG. 1), the spool being rotatably mounted on a vertical shaft 54 in proximity to the chuck. As indicated hereinbefore, the cam control means is adapted to open those clamping elements 21 which lie between the angles 45° and 250°. Accordingly, the topmost clamping elements on the chuck are always in their open position with a portion of the shaft 35 of each being exposed between its head 36 and its bushing 34 (FIG. 5).

In initially feeding the chuck, the lead 18 is drawn from the spool 47 and passed over the exposed shafts of the topmost clamping elements of the chuck. Rotation of the disc 30 in a clockwise direction then operates to bring successive clamping elements into contact with the lead 18. The location of the leading edge of the cam 39 insures that each of the clamping elements is opened prior to contacting the lead so that the lead is permitted to engage its shaft 35. Continued rotation of a clamping element after it contacts the lead 18 brings the element to the 45° position where it drops off the trailing end of the cam 39. At this point, the spring 38 clamps the head 36 against the bushing 34 thereby gripping the lead between the jaws of the element. Further rotation of the disc 30 draws still more lead from the freely rotating spool 47.

In this way, the chuck 19 serves to feed the lead from the spool 47 into the apparatus. Furthermore, equal lengths of lead are tautly clamped between adjacent closed clamping elements which lie out of contact with the cam 39. These lengths of lead are successively located in bonding position by controlled rotation of the disc 30.

As will be described in detail hereinafter, the bonding position of the lead 18 in the apparatus of FIG. 1 is that occupied by the length of lead **18*a* (FIG. 6). In this position, the lead 18*a* is substantially horizontally disposed a preselected distance away along a perpendicular from the axis of rotation R—R. It is, of course, evident that the lengths of the leads and their distance from the axis of rotation may be accurately varied by changing the number and/or the location of the clamping elements 21**.

Accurate angular location of the length of lead **18*a* into bonding position is advantageously provided by reference means. In this embodiment, such means take the form of a detent which includes a hub 45 attached to the disc 30 and extending between the back disc face 41 and the front face 40 of the housing 31. Ten equally spaced holes 44 are provided in the back face 24 of the hub 45. These holes are arranged in a circular array about the axis of rotation R—R. A spring-biased ball element 46 is then adapted to extend from the front face 40 of the housing 31. This ball element is of a larger diameter than the holes 44 and is positioned to intersect the circular path described by them. Furthermore, the ball element is located in an angular position such that it mates with a hole 44** whenever a length of lead reaches its bonding position.

In the present embodiment, manual means for rotating and positioning the disc 30 have been shown for the sake of simplicity. It will be appreciated, however, that the chuck means provided by the invention readily lends itself to automatic operation.

Referring now to FIG. 1, the apparatus includes a stand 50 which supports three vertical uprights 51, 52 and 66. The housing 31 of the chuck 19 is attached to the upright 51 by means of an extension arm 53. Accordingly, the disc 30 is mounted so as to rotate relative to the stand 50. The spool 47 is also conveniently mounted on the upright 51 in order to be near the disc 30.

The description of the apparatus of FIG. 1 is facilitated if orthogonal axes X, Y and Z are utilized for reference. In this reference system, the chuck 19 is mounted so that the face 42 of the disc 30 lies in a plane defined by the Y and Z axes.

The apparatus further includes a movable platform 55 which is mounted on the stand 50. The platform 55 is adapted to be moved relative to the stationary stand 50 in a direction parallel to the X axis of the reference system. A crank 56 is provided to move the platform 55 either forward or backward in the X direction. In this description, forward is defined as movement to the left and backward as movement to the right in FIG. 1. The means whereby the crank 56 causes movement of the platform is any of a variety of well-known mechanical systems such as a rack and pinion, generally designated by the numeral 96 and shown in dotted lines in FIG. 7.

An orientation unit 57 is located on the movable platform 55. This orientation unit is provided with means for holding the transistor 10 to which conductive leads are to be bonded. Such means may advantageously comprise a socket 58 (FIG. 2) provided with three holes positioned so as to accommodate the transistor leads 13, 14 and 15.

These socket holes may also be used to position the transistor 10 in a preselected angular position with respect to the orientation unit 57. In the fabrication of the transistor 10, a wafer bonding operation occurs prior to the instant lead bonding operation. In order to adapt the transistor for use in the apparatus of FIG. 1, this wafer bonding operation should result in a disposition of the wafer 11 such that an imaginary line S—S (FIG. 4) passing centrally between the stripes 16 and 17 along the face of the wafer lies perpendicular to and bisects an imaginary line joining the terminals 13 and 14. The angular position of the transistor 10 as defined by the socket holes is then chosen such that the imaginary line S—S lies parallel to the X axis of the reference system.

Ordinarily, the base portion 12 of the transistor 10 is provided with a flange 22. In that event, the socket 58 may be adapted to accommodate the flange 22 by means of an annular recess. As shown in FIG. 1, a clamp 59 having a fork arrangement which fits over the body portion 12 and onto the flange 22 may then be utilized to hold the ransistor 10 firmly in place. Advantageously, the socket 58 should be replaceable so that different sockets may be substituted to accommodate different transistor types.

The orientation unit 57 is adapted to move the transistor 10 to a preselected position in the plane defined by the X and Z axes. For this purpose, the unit is provided with a joy stick 60 which operates through a control system to move the orientation unit 57 relative to the platform 55 in either an X or a Z direction. The control system utilized may be, for example, of the type described in an article by W. L. Bond entitled "Micromanipulators" and published in the 1956 Bell Laboratories Record, volume 34, pages 90–92.

In the present embodiment, optical means are utilized to indicate when the transistor 10 is positioned in the proper X and Z coordinates by the orientation unit 57. This optical means comprises a microscope 61 which is attached through the vertical upright 52 to the stand 50. The microscope 61 thereby is held in a stationary reference position. A projection means 62 is attached to the eyepiece of the microscope to produce an image on a screen 63 which may be easily viewed by the operator. Advaneageously, two rectangular patterns 64 are inscribed on the screen 63 in positions which correspond to the location of the stripes 16 and 17 when the transistor 10 is correctly positioned. In this way, the operator may readily orient the transistor 10 by manipulating the joy stick 60 until the stripes 16 and 17 fit into the screen patterns.

Optical means which require operator control have been shown in FIG. 1 for the sake of simplicity. However, positioning of the transistor 10 may be automatically effected by means of an electro-optical positioning apparatus provided by A. Heinz, as described in copending patent application Serial No. 843,960 filed October 2, 1959 (now patent 3,029,348) and assigned to the assignee of the present application.

The above-described orienting step is the only one required by the apparatus in its performance of the transistor bonding operation. In the X direction, this step accurately positions the transistor 10 a preselected distance A away from the bonding tool forming a part of the apparatus. This initial X position of the transistor is shown in solid lines in FIG. 7. In the Z direction, this step accurately positions the transistor so that the imaginary line S—S (FIG. 4) bisects the length of conductive lead **18*a*** (FIG. 6) as held in its bonding position.

In the X direction, the distance A by which the transistor 10 is separated from the apparatus bonding tool also separates a first stop element 65 from a reference block 67. The stop element 65 is mounted on the platform 55 by means of the vertical upright 66. Advantageously, the stop 65 is adapted to be movable in its X position (for example, by being screwed into the upright 66) in order to provide for initial adjustment.

Figure 7:
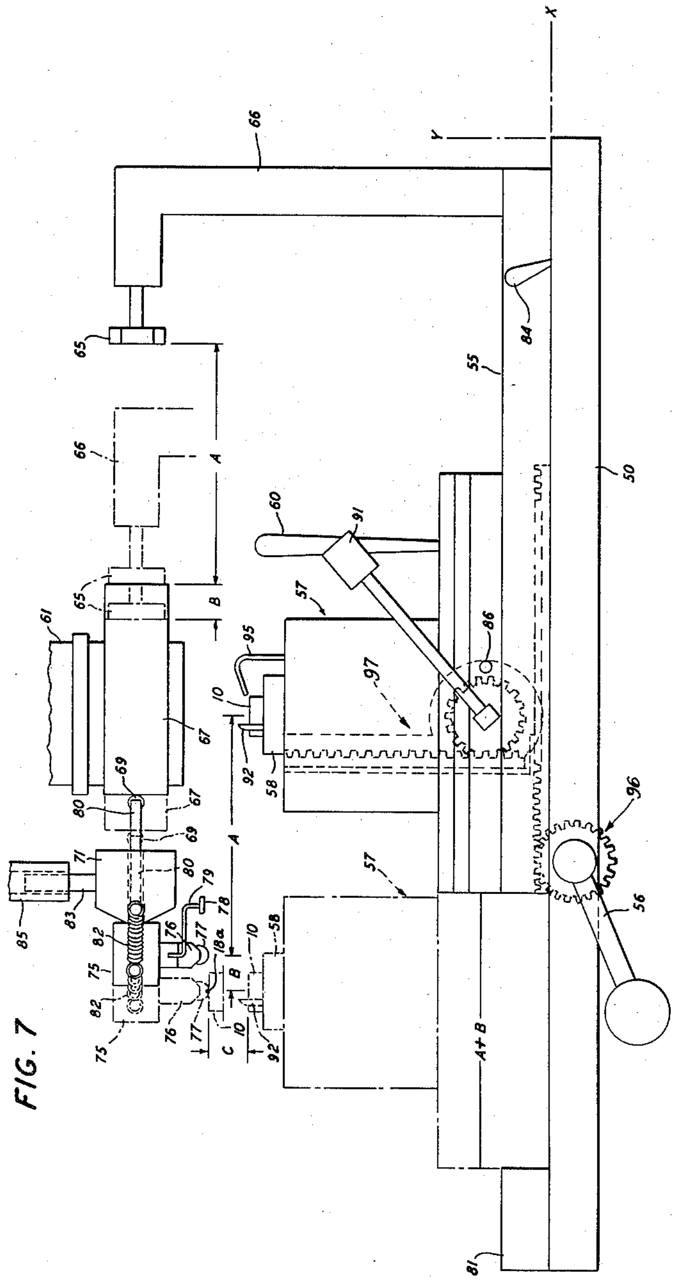
FIG. 7 is a schematic diagram illustrating the positioning sequence followed by the apparatus of FIG. 1.

Accordingly, movement of the platform 55 toward the left the distance A by means of the crank 56 moves the stop 65 into contact with the block 67 and the transistor 10 into alignment with the apparatus bonding tool, as shown in broken lines in FIG. 7. The bonding tool (FIG. 1) is supported by an overhang 70 which is attached to the extension 53 and which is therefore stationary with respect to the stand 50. A stop block 71 is suspended from the overhang member 70 by means of a shaft 72 which fits snugly through an opening in the support 70. The shaft 72 has a threaded upper portion which protrudes above the support 70 and terminates at its upper end in a head 73. A set nut 74 is secured onto this threaded upper portion and prevents the shaft from falling through the opening in the overhang. This set nut is used to adjust the distance by which the stop block 71 extends below the overhang 70.

A tool block 75 is mounted on the stop block 71. The tool block is supported so as to be restrained in the Y and Z directions but to be movable in the X direction relative to the stationary stop block. To this end, a pair of rods 80 (FIG. 7) are attached to the tool block. These rods extend rearwardly and slideably in the X direction through mating openings in the stop block into contact with the forward edge of the reference block 67. Preferably, each rod 80 terminates in a wheel 69 to permit relative vertical movement between the rods and the block 67 for reasons to be described hereinafter. Furthermore, the tool block 75 is normally held in contact with the stop block 71 by means of a spring 82. In this normal position, the rods 80 are of such a length as to position the rear edge of the reference block 67 the distance A from the stop element 67.

The tool block 75 is utilized to support the bonding tool. For this purpose, a pair of axle bearings 76 extend vertically from the tool block (FIG. 2). These bearings are utilized to support a pair of vertical bonding wheels 77 which are arranged to rotate in parallel Y—X planes about the same Z axis. The peripheries of these bonding wheels serve as bonding edges, the spacing between these edges in the Z direction being equal to the corresponding spacing between the stripes 16 and 17 of the transistor 10. Furthermore, the tool block 75 is positioned in the Z direction such that the bonding edges occupy, respectively, the same Z coordinates as do the stripes 16 and 17 when correctly positioned by the orientation unit 57.

Figure 8:
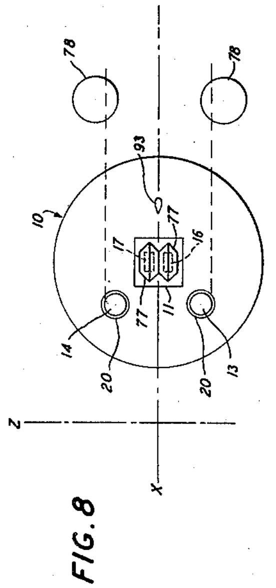
FIG. 8 is a schematic top view of the bonding area of the apparatus of FIG. 1 at a preselected instant in the sequence illustrated in FIG. 7.

The bonding tool also comprises a pair of horizontal bonding wheels 78. These wheels are attached to the tool block 75 by means of rods 79 made of spring material. The spring rods extend rearwardly from the tool block 75 and terminate in vertical end portions 25. The vertical end portions serve as axles for the wheels 78 which are arranged to rotate in the same X—Z plane. The peripheries of these bonding wheels also serve as bonding edges, the spacing between the inner extremities of these bonding edges in the Z direction being slightly less than the corresponding spacing between the outer extremities of the transistor terminals 13 and 14 (FIGS. 4 and 8). Furthermore, the inner extremities of the bonding wheels 78 are equidistantly positioned in the Z direction to either side of an imaginary X line lying centrally between the bonding wheels 77.

It has been mentioned that moevment of the platform 55 by the distance A brings the transistor 10 into alignment with the bonding tool. The alignment contemplated is illustrated in FIG. 8 and occurs when the stripes 16 and 17 of the transistor are in direct vertical alignment with the bonding wheels 77. In effecting such alignment, the aforementioned initial orientation of the transistor 10 and the geometry of the bonding tool insure accurate relative positioning of the stripes and bonding wheels in the Z direction. In addition, the aforementioned separation by the distance A of the stop element 65 relative to the reference block 67 insures accurate movement of the transistor 10 into alignment in the X direction.

The reference block 67, however, is mounted in an annular channel 68 in the microscope 61 which restrains the block in the Y and Z directions but not in the X direction. This type of mounting is effected by the provision of a bore in the block 67 which is wider in the X direction than in the Z direction, the width in the Z direction being such that the bore mates with the channel 68. Thus, continued movement of the platform 55 toward the left causes the stop 65 to urge along the reference block 67 as well. This applies a pushing force through the rods 80 to the tool block 75 against the action of the spring 82. The continued movement of the platform 55 thereby causes coincidental movement of the bonding tool which retains tool and transistor alignment.

The apparatus is adapted so that this joint movement of the bonding tool and transistor to the left continues for a preselected distance B. To that end, a stop block 81 is positioned in the path of the platform 55 a distance $A+B$ in front of the platform. As a result of this joint movement, the bonding wheels 77 and the stripes 16 and 17 are brought into vertical alignment with the length of conductive lead **18*a* as held in bonding position by the chuck 19**. The initial orientation of the transistor in the Z direction insures that this alignment will take place essentially at the center of the length of lead 18a. Furthermore, the bonding tool and transistor are positioned in respective Y coordinates sucht that the former is alinged above and the latter below the lead. It should be noted that the clamping elements 21 are projected from the front face 42 of the disc 30 so as to provide adequate space for the transistor and bonding tool to be moved into such alignment.

With this alignment accomplished, the bonding operation itself may take place. A thermocompression bonding technique is advantageously utilized. In such techniques, the transistor 10 is ordinarily heated. Mechanical vibrations at ultrasonic frequencies may also be used as a bonding aid in place of heating the transistor.

The transistor may be heated by electrical means such as a coil 23 adjusted to heat up the socket 58. To provide ample heating time, electrical energy should be applied to the coil 23 as the platform 55 first begins its movement. A manually operated switch 84 may be utilized for this purpose. Typically, the transistor is heated to a temperature of approximately 325° C., which is well below the melting point of any of the elements involved.

The thermocompression bonding operation also requires that a preselected pressure be applied to compress the conductive lead 18a against the stripes on the heated transistor. Typically a pressure of approximately 20,000 pounds per square inch is utilized. In the present invention, the above-described bonding tool is employed to apply this pressure.

As has been noted, the stop block 71 is suspended from the overhang support 70 by means of the shaft 72 whereby movement of the stop block in an upward Y direction is not restrained. Furthermore, guide posts 83 are slidably inserted in cylinders 85 to restrain movement of the stop block in the X and Z directions while permitting this vertical displacement. Accordingly, upward forces applied to the bottom edges of the vertical bonding wheels 77 are translated through to tool block 75 and rods 80 into upward movement of the stop block 71. The wheels 69 facilitate vertical movement of the rods 80 relative to the reference block 67.

The required bonding pressure is applied by moving the transistor 10 vertically upward a preselected distance C (FIG. 7). The means for effecting such movement includes, in this embodiment, a handle 91 which is swingable in a vertical plane, its motion in a downward arc being translated through jack means such as a rack and pinion, generally designated by numeral 97, FIG. 7 into upward movement of the orientation unit 57. A stop 86 is interposed in the path of the handle to automatically stop the upward movement of the transistor 10 after it has traveled the distance C.

The distance C is such that the transistor 10 moves upward into contact with the lead 18a, carries the lead 18a into contact with the vertical bonding wheels 77, and then moves both the lead 18a and the bonding wheels 77 upward a further short increment. The vertical movement of the lead which is entailed may be limited to a minimum by adjusting the Y position of the bonding wheels 77 by means of the set nut 74 (FIG. 1) so that the bottom edges of the wheels almost graze the top of the lead 18a. This is permissible since each successive length of lead is accurately positioned in the same vertical (Y) coordinate by the chuck 19.

Because of the previously accomplished alignment of the transistor stripes 16 and 17 with the lead 18a and the vertical bonding wheels 77, movement of the transistor 10 by the vertical distance C results in orientation shown in FIG. 2. Furthermore, upward movement of the bonding wheels by the transistor is effected only by counteracting the downward weight of the mass suspended from the overhang support 70 via the shaft 72. Consequently, a downward pressure is applied by each bonding wheel 77 which compresses the lead 18a against the aligned heated stripe 16 or 17 to form a thermocompression bond.

It is desirable that the value of this pressure be accurately controlled. In this embodiment, such control is provided by means of an arm 87 (FIG. 1) mounted on a pivot 88. The arm 87 has an adjustably positioned weight 89 attached to one end and terminates at the other end in a fork 90. The fork 90 is fitted about the shaft 72 under the head 73 thereby to apply a lifting force to the shaft. This lifting force is determined by the value and position of the weight 89 and acts to counterbalance the weight applied to the bonding wheels 77. Proper adjustment of the position of the weight 89 therefore serves to accurately control bonding pressure.

Having completed the bonding of the lead 18a to the transistor stripes 16 and 17, the operator next rotates the crank 56 in the reverse direction to return the platform 55 back to its original position. This moves the transistor 10 and the now bonded lead 18a away from the chuck 19. Means are therefore provided to sever the lead 18a at its ends close to the clamping elements 21 to free it from the chuck. These means are adapted to accomplish such severance only after the bonds to the stripes 16 and 17 have been completed in order that control over the lead be constantly maintained.

In the present embodiment, individual cutting elements 92 (FIG. 2) are utilized for this purpose. The cutting elements 92 are mounted on the socket 58 in appropriate X and Z coordinates such that they rise to the left of and in Z alignment with the ends of the lead 18a near the clamping elements 21 when the transistor is brought up into bonding posiiton. Movement of the platform 55 to the right therefore causes the cutting elements to effect the desired severance.

During the first part of the reverse movement of the platform 55, the bonding tool moves along with the transistor 10 under the influence of the spring 82. However, this joint movement is terminated after the bonding tool and transistor have moved backward the distance B because the tool block 75 comes into contact with the stop block 71. Thereafter, continued movement of the platform displaces the transistor 10 to the right relative to the bonding tool. As a result, the bonding wheels 77 rotate to the left off the stripe area.

Continued backward movement of the platform brings a knife element 93 into the stripe area. The knife 93 is mounted on the block 75 by means of a bracket 94 rearwardly of the bonding wheels 77. Furthermore, the knife is accurately located in Z and Y coordinates such that it passes directly between the stripes 16 and 17 at the correct level for cutting through the lead 18. The knife 93 thereby eliminates what otherwise would be a short circuit between the stripes 16 and 17.

Further backward movement of the platform 55 brings the horizontal bonding wheels 78 into the stripe area. As indicated hereinbefore and as illustrated in FIG. 8, the location of these bonding wheels in their respective Z coordinates is such that the inner surface of each wheel is adapted to intercept the outer surface of a different one of the transistor terminals 13 and 14. Furthermore, the bonding wheels 78 are located in a Y coordinate such that each skims along the surface of the transistor body portion 12 to intercept a different one of the loose ends of the lead 18a. Advantageously, the bonding wheels 78 are made relatively wide in the Y direction to insure such interception.

Continued movement of the transistor 10 to the right therefore causes each horizontal bonding wheel 78 to sweep its respective loose lead end against the outer surface of its respective terminal 13 or 14. Furthermore, the spacing of the bonding wheels relative to the spacing of the terminals is such that the terminals must push the wheels outwardly against the action of the spring rods 79 in order to pass therebetween. As shown in FIG. 4, this causes each bonding wheel to rotate around its associated terminal while applying pressure to the loose end of lead caught therebetween. Thermocompression bonds which may cover an arc of 90° or more are thereby formed between the ends of the conductive lead and the heated terminals. The platform 55 is then returned to its original position where the finished transistor is removed.

Although the horizontal bonding wheels 78 may be used alone for sweeping the loose ends of the lead 18*a* about the terminals 13 and 14, it has sometimes been found desirable to employ an air blast for this purpose. The air blast may be provided, for example, by means of a tube 95 attached to the orientation unit 57. The tube 95 is advantageously oriented so as to direct the air blast at an acute angle to the surface of the transistor body portion 12 and at a point on that surface which lies lightly in front of the lead 18*a*. In this way, the air blast is deflected off the transistor surface to give the loose end portions of the lead a slightly upward lift.

It is to be understood that the above-described arrangements are simply illustrative of the application of the principles of the invention. Numerous other arrangements may be devised by those skilled in the art which will embody the principles of the invention and fall within the spirit and scope thereof.

What is claimed is:

1. Apparatus for bonding a wire-like member to first and second surfaces, comprising a bonding tool having first and second bonding elements, said first bonding element being arranged to apply pressure against said first surface and said second bonding element being arranged to apply pressure against said second surface, means for orienting a first portion of said wire-like member between said first bonding element and said first surface, means including said first bonding element for pressing said first portion of said wire-like member against said first surface to form a first bond between said member and said first surface, means for moving said bonding tool laterally past said second surface, and means including said second bonding element for sweeping and pressing a second portion of said wire-like member against said second surface to form a second bond between said member and said second surface.

2. Apparatus in accordance with claim 1, which includes means for heating said first and second surfaces to form thermocompression bonds between said wire-like member and said surfaces.

3. Apparatus for bonding a wire-like member to first and second surfaces, comprising a bonding tool having first and second bonding elements, said first bonding element being arranged to apply pressure against said first surface and said second bonding element being arranged to apply pressure against said second surface, means for moving said bonding tool laterally past said second surface, means for orienting a first portion of said wire-like member between said first bonding element and said first surface and for orienting a second portion of said wire-like member across the path followed by said second bonding element during said lateral movement, means including said first bonding element for pressing said first portion of said wire-like member against said first surface to form a first bond between said member and said first surface, said second bonding element being adapted and arranged to sweep said second portion of said wire-like member against said second surface during said lateral movement, and means including said second bonding element for pressing said second portion of said wire-like member against said second surface to form a second bond between said member and said second surface.

4. Apparatus for bonding a wire-like member to first and second surfaces, comprising a bonding tool having first and second bonding elements, said first bonding element being arranged to apply pressure against said first surface and said second bonding element being arranged to apply pressure against said second surface, means for orienting a first portion of said wire-like member between said first bonding element and said first surface, means including said first bonding element for pressing said first portion of said wire-like member against said first surface to form a first bond between said member and said first surface, means for sweeping a second portion of said wire-like member against said second surface, means for moving said bonding tool laterally past said second surface, and means including said second bonding element for pressing said second portion of said wire-like member against said second surface to form a second bond between said member and said second surface.

5. Apparatus in accordance with claim 4, in which said means for sweeping said second portion of said wire-like member against said second surface includes a device for directing an air blast against said member.

6. Apparatus for bonding a wire-like member to first and second surfaces, comprising a bonding tool having a first bonding element and a spring-biased second bonding element, said first bonding element being arranged to apply pressure against said first surface and said second bonding element being arranged to apply pressure against said second surface, means for orienting a first portion of said wire-like member between said first bonding element and said first surface, means including said first bonding element for pressing said first portion of said wire-like member against said first surface to form a first bond between said member and said first surface, means for sweeping a second portion of said wire-like member against said second surface, means for moving said bonding tool laterally past said second surface, and means including said spring for adapting and arranging said second bonding element to press said second portion of said wire-like member against said second surface during said lateral movement to form a second bond between said member and said second surface.

7. Apparatus for bonding a wire-like member to first and second surfaces, comprising a bonding tool having a first bonding element and a spring-biased second bonding element, said first bonding element being arranged to apply pressure against said first surface and said second bonding element being arranged to apply pressure against said second surface, means for moving said bonding tool laterally past said second surface, means for orienting a first portion of said wire-like member between said first bonding element and said first surface and for orienting a second portion of said wire-like member across the path followed by said second bonding element during said lateral movement, means including said first bonding element for pressing said first portion of said wire-like member against said first surface to form a first bond between said member and said first surface, and means including said spring for adapting and arranging said second bonding element to sweep and press said second portion of said wire-like member against said second surface during said lateral movement to form a second bond between said member and said second surface.

8. Apparatus for bonding a wire-like member to first and second surfaces, comprising a bonding tool having a first rotatably mounted bonding wheel and a spring-biased second rotatably mounted bonding wheel, the periphery of said first bonding wheel being arranged to apply pressure against said first surface and the periphery of said second bonding wheel being arranged to apply pressure against said second surface, means for orienting a first portion of said wire-like member between the periphery of said first bonding wheel and said first surface, means including said first bonding wheel for pressing said first portion of said wire-like member against said first surface to form a first bond between said member and said first surface, means for sweeping a second portion of said wire-like member against said second surface, means for moving said bonding tool laterally past said second surface, and means including said spring for adapting and arranging said second bonding wheel to press said second portion of said wire-like member against said second surface during said lateral movement to form a second bond between said member and said second surface.

9. Apparatus for bonding a wire-like member to first and second surfaces, comprising a bonding tool having a first rotatably mounted bonding wheel and a spring-biased second rotatably mounted bonding wheel, the periphery of said first bonding wheel being arranged to apply pressure against said first surface and the periphery of said second bonding wheel being arranged to apply pressure against said second surface, an arm mounted on a pivot, said bonding tool being situated on said arm with the pressure axis of said first bonding wheel transversely disposed relative to the axis of said arm, means for orienting a first portion of said wire-like member between the periphery of said first bonding wheel and said first surface, means for moving said pivot relative to said first surface to bring said first bonding wheel to bear against said wire-like member, said arm being weighted so that a substantially constant preselected pressure is applied to form a first bond between said member and said first surface, means for sweeping a second portion of said wire-like member against said second surface, means for moving said bonding tool laterally past said second surface, and means including said spring for adapting and arranging said second bonding wheel to press said second portion of said wire-like member against said second surface during said lateral movement to form a second bond between said member and said second surface.

10. Apparatus for bonding conductive lead to a semiconductive device which includes a pair of contact areas arranged in substantially the same plane and a separate terminal for each said contact area, comprising a bonding tool having a first and a second pair of rotatably mounted bonding wheels, spring-bias means for each of said second pair of bonding wheels, the peripheries of said first pair of bonding wheels being arranged to apply pressure against a different one of said contact areas respectively, the peripheries of said second pair of bonding wheels being arranged to apply pressure against a different one of said terminals respectively, means for orienting first portions of said conductive lead between the peripheries of said first pair of bonding wheels and said contact areas, means including said first bonding wheels for pressing said first portions of said conductive lead against said contact areas to form bonds between said lead and said areas, means for sweeping second portions of said conductive lead against said terminals, means for moving said bonding tool laterally past said terminals, and means including said spring-bias means for adapting and arranging said second bonding wheels to press said second portions of said conductive lead against said terminals during said lateral movement to form bonds between said lead and said terminals.

11. Apparatus in accordance with claim 10, which includes a knife-like cutter disposed between said first bonding wheels to slice through said conductive lead between the bonds formed at said contact areas during said lateral movement.

12. A bonding tool, comprising a first pair of bonding wheels and a second pair of bonding wheels, said first pair of bonding wheels being mounted to rotate in closely spaced substantially parallel planes respectively, each of said second pair of bonding wheels being mounted to rotate in a plane disposed substantially at right angles to said parallel planes, and each of said second pair of bonding wheels being spring-biased to apply pressure in a direction substantially parallel to its said plane of rotation.

13. A bonding tool, comprising a support, a first pair of bonding wheels and a second pair of bonding wheels, said first pair of bonding wheels being mounted on said support to rotate in closely spaced substantially parallel planes respectively, a pair of spring-biased suspension elements extending from said support, and each of said second pair of bonding wheels being mounted on a different one of said suspension elements to rotate in a plane disposed substantially at right angles to said parallel planes.

14. Apparatus for bonding a wire-like member to first and second surfaces, comprising a bonding tool having first and second bonding elements, said first bonding element being arranged to apply pressure against said first surface and said second bonding element being arranged to apply pressure against said second surface, means for holding a length of said wire-like member in a preselected bonding position between said first bonding element and said first surface, means including said first bonding element for pressing said wire-like member against said first surface to form a first bond between said member and said first surface, means for separating said length of wire-like member from said holding means after said first bond is formed, means for moving said bonding element laterally past said second surface, and means including said second bonding element for sweeping and pressing a free end of said length of wire-like member against said second surface to form a second bond between said wire-like member and said second surface.

15. Apparatus for bonding a wire-like member to first and second surfaces, comprising a bonding tool having first and second bonding elements, said first bonding element being arranged to apply pressure against said first surface and said second bonding element being arranged to apply pressure against said second surface, chuck means for successively feeding and accurately locating preselected lengths of said wire-like member into bonding position between said first bonding element and said first surface, said chuck means including a support mounted to rotate about an axis, a plurality of individual clamping elements mounted on said support in an array about said axis, means for rotating said support about said axis to bring each of said elements into contact with said wire-like member successively, and control means for causing each said element to open prior to contacting said wire-like member and to close after contacting said wire-like member thereby to grip said member and for maintaining two adjacent clamping elements closed to grip a length of said wire-like member therebetween at a preselected position in said rotation corresponding to said bonding position, said clamping elements being mounted to project from said support so that said length of wire-like member is tautly suspended therebetween, means including said first bonding element for pressing said wire-like member against said first surface to form a first bond between said member and said first surface, means for separating said length of wire-like member from said adjacent clamping elements after said first bond is formed, means for moving said bonding element laterally past said second surface, and means including said second bonding element for sweeping and pressing a free end of said length of wire-like member against said second surface to form a second bond between said wire-like member and said second surface.

16. Apparatus for bonding a wire-like member to first and second surfaces, comprising a bonding tool having first and second bonding elements, said first bonding element being arranged to apply pressure against said first surface and said second bonding element being arranged to apply pressure against said second surface, means for holding a length of said wire-like member in a preselected bonding position, means for moving said first surface and said first bonding element into alignment on opposite sides of said length of wire-like member, means including said first bonding element for pressing said wire-like member against said first surface to form a first bond between said member and said first surface, means for separating said length of wire-like member from said holding means after said first bond is formed, means for moving said bonding element laterally past said second surface, and means including said second bonding element for sweeping and pressing a free end of said length of wire-like member against said second surface to form a second bond between said member and said second surface.

17. Apparatus for bonding a wire-like member to first and second surfaces, comprising a bonding tool having first and second bonding elements, said first bonding element being arranged to apply pressure against said first surface and said second bonding element being arranged to apply pressure against said second surface, chuck means for successively feeding and accurately locating preselected lengths of said wire-like member into bonding position, said chuck means including a support mounted to rotate about an axis, a plurality of individual clamping elements mounted on said support in an array about said axis, means for rotating said support about said axis to bring each of said elements into contact with said wire-like member successively, and control means for causing each said element to open prior to contacting said wire-like member and to close after contacting said wire-like member thereby to grip said member and for maintaining two adjacent clamping elements closed to grip a length of said wire-like member therebetween at a preselected position in said rotation corresponding to said bonding position, said clamping elements being mounted to project from said support so that said length of wire-like member is tautly suspended therebetween, means for moving said first surface and said first bonding element into alignment on opposite sides of said length of wire-like member, means including said first bonding element for pressing said wire-like member against said first surface to form a first bond between said member and said first surface, means for separating said length of wire-like member from said adjacent clamping elements after said first bond is formed, means for moving said bonding element laterally past said second surface, and means including said second bonding element for sweeping and pressing a free end of said length of wire-like member against said second surface to form a second bond between said wire-like member and said second surface.

18. Apparatus for bonding conductive lead to a semiconductive device which includes a pair of contact areas arranged in substantially the same plane and a separate terminal for each said contact area, comprising a bonding tool having a first and a second pair of rotatably mounted bonding wheels, spring-bias means for each of said second pair of bonding wheels, the peripheries of said first pair of bonding wheels being arranged to apply pressure against a different one of said contact areas respectively, the peripheries of said second pair of bonding wheels being arranged to apply pressure against a different one of said terminals respectively, means for holding a length of said conductive lead in a preselected bonding position, means for moving said contact areas and the peripheries of said first bonding wheels into alignment on opposite sides of said length of conductive lead, means including said first bonding wheels for pressing said conductive lead against said contact areas to form first bonds between said lead and said areas, means for separating said length of conductive lead from said holding means after said first bonds are formed, means for sweeping free portions of said conductive lead against said terminals, means for moving said bonding tool laterally past said terminals, and means including said spring-bias means for adapting and arranging said second bonding wheels to press said free portions of said conductive lead against said terminals during said lateral movement to form second bonds between said lead and said terminals.

19. Apparatus for bonding conductive lead to a semiconductive device which includes a pair of contact areas arranged in substantially the same plane and a separate terminal for each said contact area, comprising a bonding tool having a first and a second pair of rotatably mounted bonding wheels, spring-bias means for each of said second pair of bonding wheels, the peripheries of each of said first pair of bonding wheels being arranged to apply pressure against a different one of said contact areas respectively, the peripheries of each of said second pair of bonding wheels being arranged to apply pressure against a different one of said terminals respectively, chuck means for successively feeding and accurately locating preselected lengths of said conductive lead into bonding position, said chuck means including a support mounted to rotate about an axis, a plurality of individual clamping elements mounted on said support in an array about said axis, means for rotating said support about said axis to bring each of said elements into contact with said conductive lead successively, and control means for causing each said element to open prior to contacting said lead and to close after contacting said lead thereby to grip said lead and for maintaining two adjacent clamping elements closed to grip a length of said lead therebetween at a preselected position in said rotation corresponding to said bonding position, said clamping elements being mounted to project from said support so that said length of lead is tautly suspended therebetween, means for moving said contact areas and the peripheries of said first bonding wheels into alignment on opposite sides of said length of conductive lead, means including said first bonding wheels for pressing said conductive lead against said contact areas to form first bonds between said lead and said areas, means for separating said length of conductive lead from said adjacent clamping elements after said first bonds are formed, means for sweeping free portions of said conductive lead against said terminals, means for moving said bonding tool laterally past said terminals, and means including said spring-bias means for adapting and arranging said second bonding wheels to press said free portions of said conductive lead against said terminals during said lateral movement to form second bonds between said lead and said terminals.

20. A device for bonding a wire-like member to preselected parts positioned adjacent the wire-like member comprising first roller means movable into pressing engagement with a first portion of the wire-like member for applying pressure thereto, second means movable into rolling and pressing engagement with a second portion of the wire-like member for applying pressure thereto, the rotational axis of said second means being substantially perpendicular to the rotational axis of said first means, means for moving said first means into pressing engagement with the first portion of the wire-like member, and means for moving said second means into rolling and pressing engagement with the second portion of the wire-like member, whereby bonds are formed between said first and second portions of said wire-like member and said parts.

References Cited in the file of this patent

UNITED STATES PATENTS

| | | |
|---|---|---|
| 1,508,974 | Jackson | Sept. 16, 1924 |
| 2,406,456 | De Witt | Aug. 27, 1946 |
| 2,465,390 | Mueller | Mar. 29, 1949 |

OTHER REFERENCES

Machine Design, February 6, 1958, p. 148.